INVENTOR.
R. GLEN MADSEN
By White & Haefliger
ATTORNEYS.

LOOP FILTER FOR PHASE LOCKED LOOP FREQUENCY DETECTOR
Filed Dec. 17, 1965 
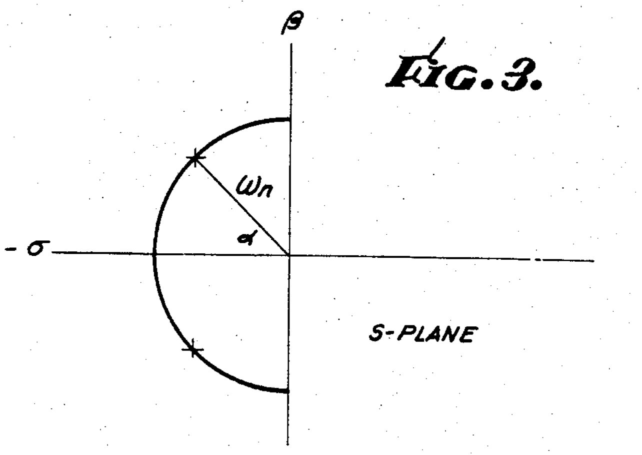
FIG. 3.
FIG. 4.
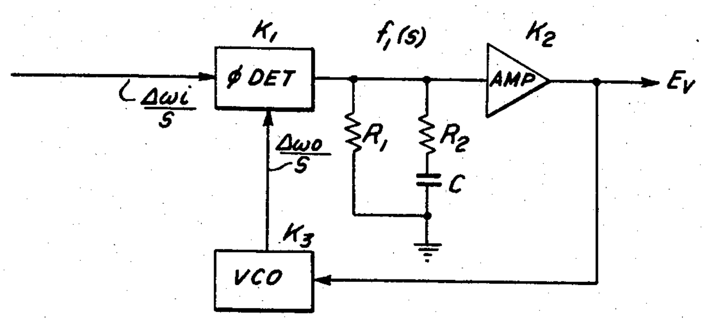
FIG. 5.
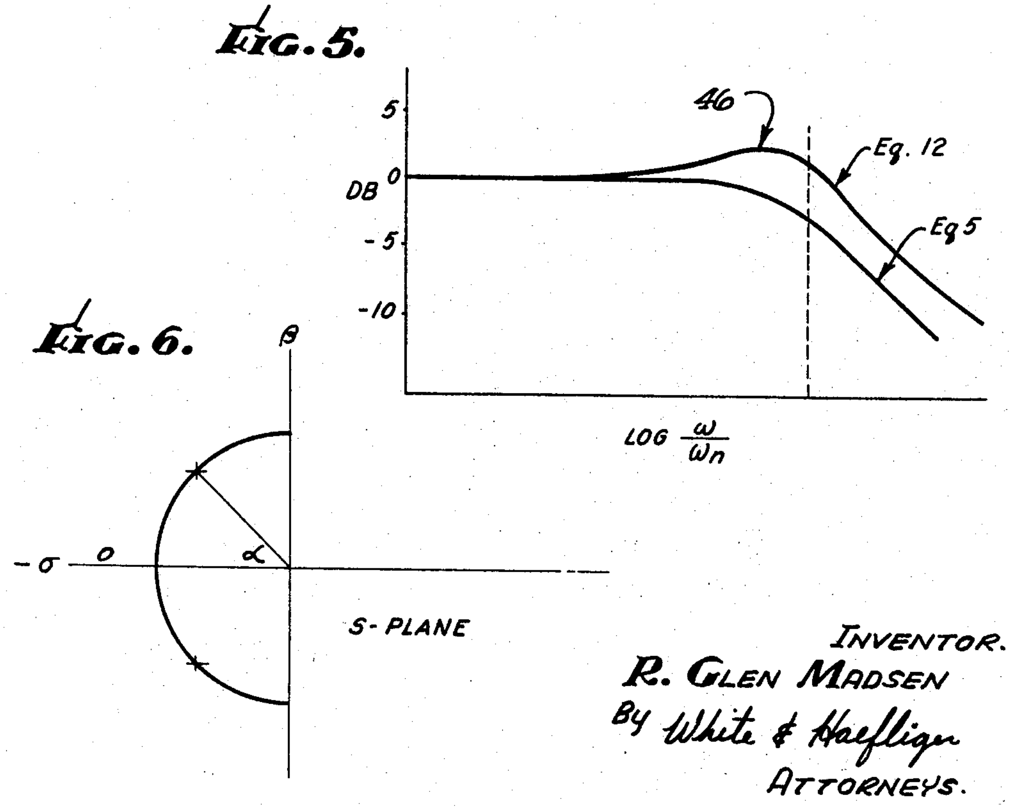
FIG. 5, FIG. 6.
INVENTOR.
R. GLEN MADSEN
By White & Haefliger
ATTORNEYS.

INVENTOR.
R. GLEN MADSEN
By White & Haefliger
ATTORNEYS.

INVENTOR.
R. GLEN MADSEN
By White & Haefliger
ATTORNEYS.

LOOP FILTER FOR PHASE LOCKED LOOP FREQUENCY DETECTOR

Filed Dec. 17, 1965 6 Sheets-Sheet 5

INVENTOR.
R. GLEN MADSEN
BY White & Haefliger
ATTORNEYS.

INVENTOR.
R. GLEN MADSEN
BY White & Haefliger
ATTORNEYS.

United States Patent Office 3,375,463

Patented Mar. 26, 1968

3,375,463

LOOP FILTER FOR PHASE LOCKED LOOP FREQUENCY DETECTOR

R. Glen Madsen, Newport Beach, Calif., assignor to Astrodata, Inc., Anaheim, Calif., a corporation of California Filed Dec. 17, 1965, Ser. No. 514,480

9 Claims. (Cl. 331—17)

ABSTRACT OF THE DISCLOSURE

The invention concerns an improved loop filter for use in a phase locked loop frequency to voltage converter that also includes a phase sensitive detector and a tracking oscillator connected in a loop. The filter comprises current integrating means and loop damping means connected in series sequence between the output from the detector and the input to the oscillator, and the output of the loop is taken at a point between the integrator means and the loop damping means.

This invention relates generally to processing of phase modulated or FM signals, and more particularly concerns improvements in discriminators for deriving analog output signals from FM data input signals. More specifically, the invention concerns improvements in the loop filter components of phase locked loop frequency detectors.

Important objects of the invention include the provision of an improved loop filter enabling operation of a phase locked loop system with combinations and subcombinations of the following advantages: a frequency to voltage transfer function having no zero term in its numerator, providing substantially improved amplitude response of the phase locked loop system; lack of need for any compensating network which in the past was necessary to compensate for undesirable amplitude response of phase locked loop systems; minimal carrier component on the output voltage $E_v$ under all static and dynamic conditions; remote control of damping factor for compatibility with a constant amplitude or linear phase three pole low pass filter; incorporation of the detector in a discriminator having composite switchable 5-pole low pass filter response in which two of the poles are contributed by the phase locked loop detector and the remaining three poles are in the low pass filter, response being switchable from linear phase to constant amplitude; provision for minimum distortion in the phase locked loop detector by composite control of the oscillator such as a VCO or ICO to be described; and provision for adjustment of loop parameters to provide damping factors $\zeta$ of from zero to a damped condition where the loop response approaches that represented by a single pole on the negative real axis of the complex frequency plane.

Basically, the improved loop filter comprises current integrating means and loop damping means such as parallel resistance capacitance connected in series circuit sequence between the output from the phase sensitive detector and the input to the oscillator, the loop output being taken at a point between the integrator means and the loop damping means. The integrator means typically comprises capacitance connected in integrating mode, and a DC amplifier is typically connected between the integrating means and resistance to provide filter output. Thus the filter is in two sections with the circuit integrating means in the forward portion of the loop, and the parallel resistance capacitance or the damping control in the back section of the loop. In its various forms to be described, the filter may have other configurations to develop damping factor controlling current $i_\phi$ and may include additional capacitance connected in shunt relation with the resistance and in series circuit relation with the output from the amplifier and the input to the oscillator; or the loop filter capacitance may be connected across the output from the phase sensitive detector and the input to the amplifier; or the capacitance may include one leg connected across the output from the phase sensitive detector and the input to the amplifier, and another leg connected between the output from the phase sensitive detector and a common terminal.

As regards variation of loop damping ratio, the filter may include auxiliary impedance and a control such as a switch operable to vary the current ratio $i_\phi/i_v$ as will be described.

These and other objects and advantages of the invention, as well as the details of illustrative embodiments, will be more fully understood from the following detailed description of the drawings, in which:

FIG. 3 illustrates pole positions on the S-plane with a current mode loop filter;

FIG. 4 is a block diagram of a phase locked loop system with a conventional loop filter;

FIG. 5 illustrates an amplitude response comparison of Equations 5 and 12 to be described;

FIG. 6 illustrates pole/zero positions on the S-plane with a conventional loop filter;

Figure 1:
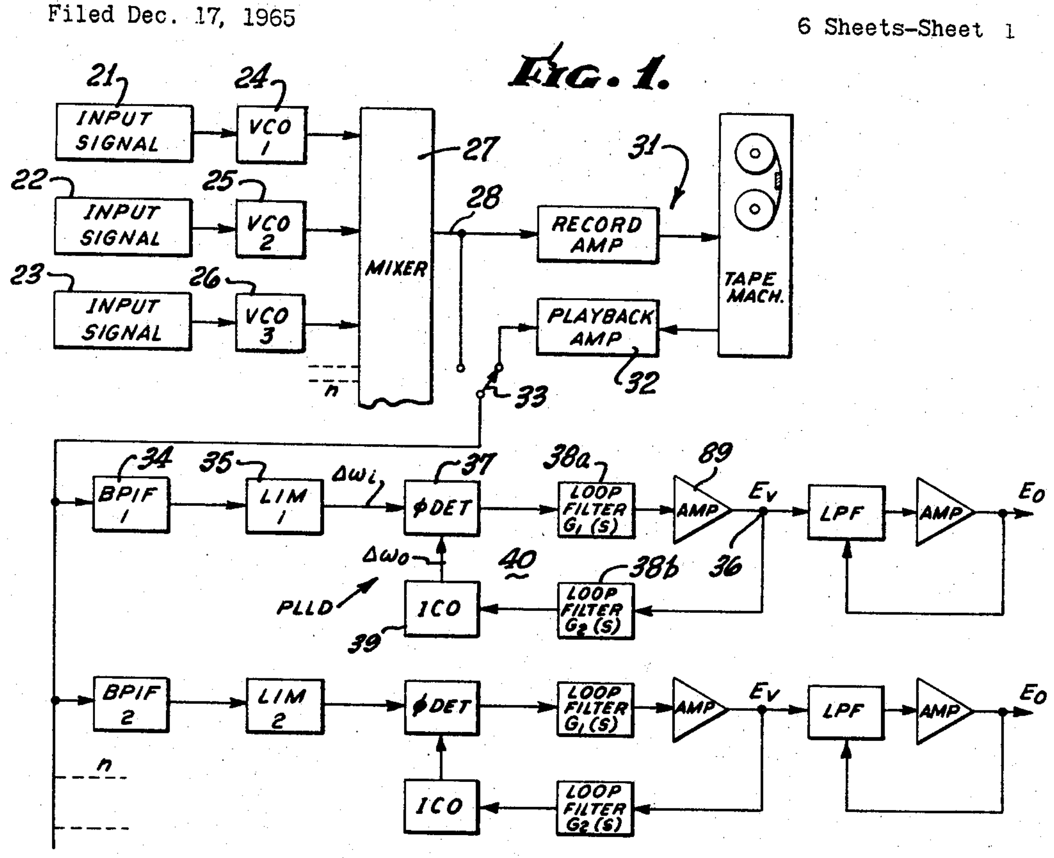
FIG. 1 is a block diagram of an FM telemetry system.

Referring now specifically to FIG. 1, there is shown a system for handling recorded information signals such as might be obtained in a standard FM-FM telemetry system wherein a carrier signal is frequency-modulated by a plurality of frequency-modulated subcarrier. Signal sources 21–23 generate DC or AC information signals which respectively modulate the output frequencies of subcarrier oscillators 24–26 about their center values. To simplify the drawing, only three channels are represented in FIG. 1. It will be understood that in practice N (say eighteen standard IRIG) channels may be simultaneously employed.

The frequency modulated subcarriers are then mixed at 27 for subsequent transmission indicated at 28. After transmission, the composite subcarrier signal may be recorded on a suitable recording medium, such as magnetic tape, by recorder 31. The recorded composite subcarrier signal is subsequently reproduced through playback amplifier unit 32 whose output is supplied to N parallel-connected channel discriminators corresponding to the number of subcarrier signals. As diagrammatically indicated by the doublethrow switch 33, the composite subcarrier signal may be directly applied to the N discriminators without first being recorded.

Each discriminator includes a band-pass input filter (BPIF) 34 which serves to extract from the composite subcarrier signal the particular channel's frequency spectrum to be demodulated. Along with the intelligence, the BPIF also passes an appreciable amount of noise falling within its pass-band, thus giving rise to a substantial noise-to-signal ratio. BPIF 34 may be either active or passive and should possess a constant time delay and a substantially smooth frequency response across its pass-band of interest and provide maximum rejection outside its band edges. Filters 34, suitably, may comprise a number of stagger tuned resonant inductor-capacitor combinations isolated from each other by buffer amplifier stages.

The output signal of BPIF 34 may first be converted into a square wave of substantially constant amplitude by a limiter 35. The output of each limiter 35 is then applied to a phase-locked loop detector (PLLD), each detector including at least three fundamental networks: a phase detector (PSD) 37, a loop filter 38 including branches **38*a* and 38*b*, and a current-controlled oscillator (ICO) 39, all cascaded around a loop 40**.

The function of the phase detector is to compare the phase of the output signal $\omega_o$ of the ICO relative to the phase of the received subcarrier signal $\omega_i$ appearing at the output of limiter 35 and to produce an average current or voltage indicative of their phase difference. The most common signals applied to the two inputs of the phase-sensitive detector are sinusoids or square waves. Therefore, ICO 39 may be either a multivibrator or a sine wave generator depending on whether a limiter 35 is employed or not.

Figure 10:
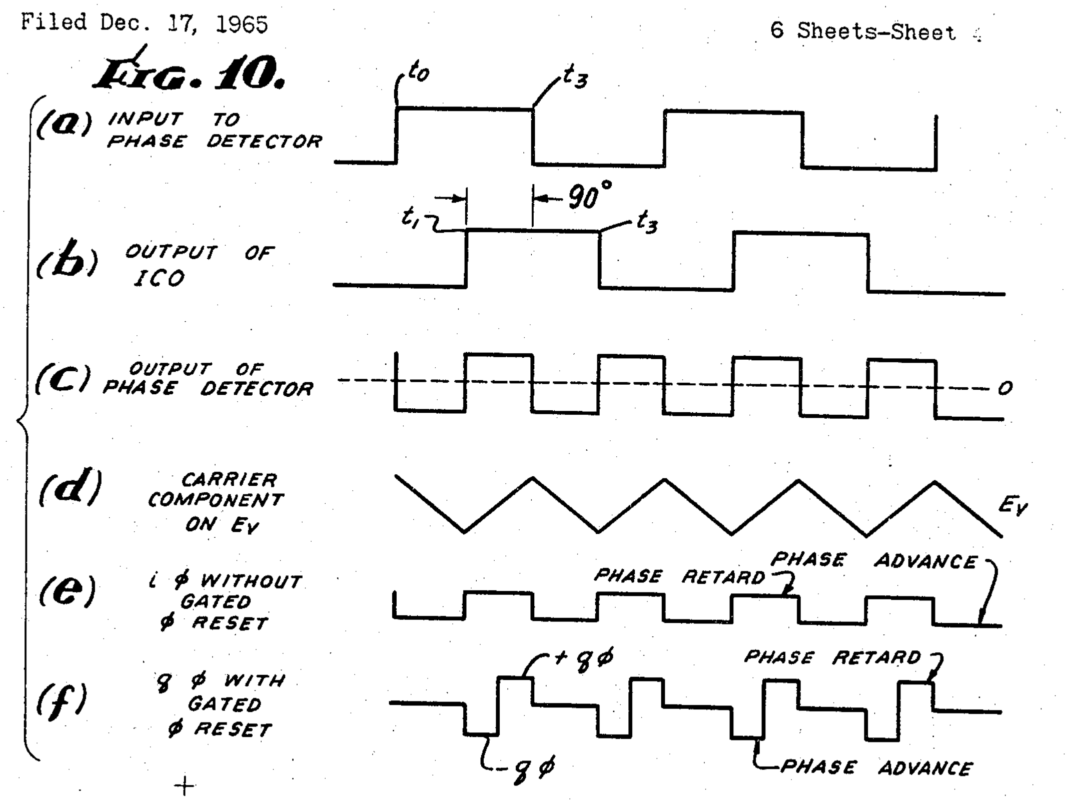
FIG. 10 shows pertinent waveforms.

In FIG. 10 the phase shift between the subcarrier input signal **10*a* to the PSD and the output wave 10*b* of the ICO is 90°. The PSD may be of the type that multiplies the two input square waves to derive a product output wave 10*c*** from the PSD, which is also a square wave whose average or DC component is zero. The 90° phase shift is taken as the reference condition, corresponding to zero input phase error, i.e. $\phi_\epsilon=0$. For positive phase error, the output product is a rectangular square wave in which the positive going pulses have a longer time duration than the negative pulses, the output rectangular wave now having a positive DC component and a fundamental double-frequency ripple. For negative phase error, the output product rectangular wave has a negative DC component and a fundamental double-frequency ripple. Thus, under static conditions, the phase error is substantially zero and under dynamic conditions, the instantaneous phase error fluctuates in response to frequency deviations (caused by intelligence, voice, noise, etc.) from the center frequency of the subcarrier signal.

The output signal from the PSD is applied to the loop filter 38, whose function is to allow the average output of the PSD to pass therethrough while attenuating as much as possible the double-frequency ripple 101 or carrier component seen in waveform **10*d*. The filter thereby establishes the dynamic conditions necessary for loop tracking. The DC component $E_v$ of the loop filter output, appearing at junction 36, is applied to loop filter branch 38*b* to modulate the frequency of the oscillator 39** about its base value. Thus, for example, the returned current includes components $i_v$ and $i_\phi$ as shown in FIG. 2*b*. In this regard, $i_v$ controls the oscillator output frequency, while the ratio $i_\phi/i_v$ controls the loop damping factor. Waveform **10*e*** shows current $i_\phi$ with balanced phase retard and phase advance portions corresponding to zero phase error; however such portions will become unbalanced in correspondence with the existence of phase error. The modulation is such as to bring the frequency of the oscillator's output signal to the same frequency as that of the subcarrier signal, but shifted 90° in phase, expressed as follows:

$\omega_o=\omega_i$ $\phi_o=\phi_i+\pi/2$, where $\phi_i$=phase angle of input frequency in radians $\phi_o$=phase angle of ICO frequency in radians The change in the oscillator's frequency is of such magnitude and direction as to seek to eliminate the phase error $\phi_\epsilon$, originally responsible for the creation of the DC component at the output of the PSD 37.

The invention principally has to do with an improved loop filter that basically comprises current integrating means and loop damping means such as resistance connected in series circuit sequence between the output from the phase sensitive detector and the input to the oscillator, the loop output being taken at a point between the integrating means in the loop forward section and the resistance in the return section of the loop. In that form of the invention seen in FIG. 2*b*, the integrating means comprises capacitance $C_1$ connected in current integrating mode, and there is also a DC amplifier 89 connected between the integrating means and the damping means resistance $R_2$ to provide the filter output $E_v$ at point 36. Also, there is additional capacitance $C_2$ connected in shunt relation with resistance $R_2$ and in series circuit between the amplifier output and the oscillator input. The oscillator 39 is designated ICO inasmuch as it may be considered as current controlled in accordance with the principles set forth in Stanley C. Forrest et al. application for U.S. Letters Patent Ser. No. 424,558, or other current controlled oscillators.

Figure 7:
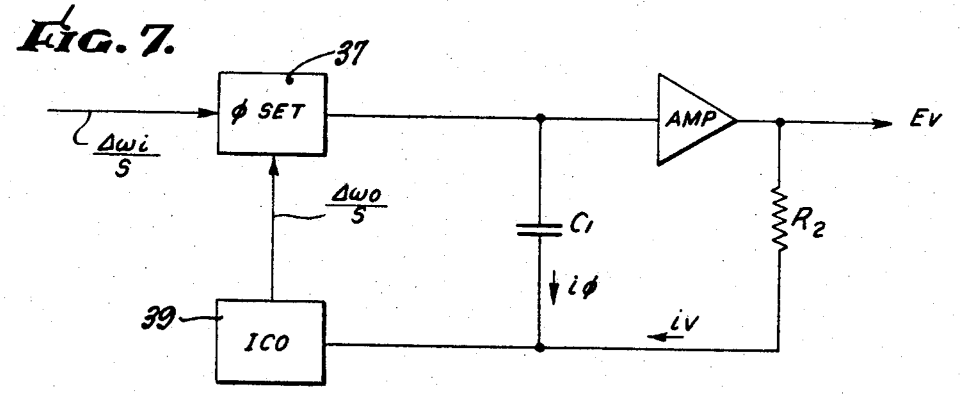
FIG. 7 illustrates a modified loop filter.
Figure 8:
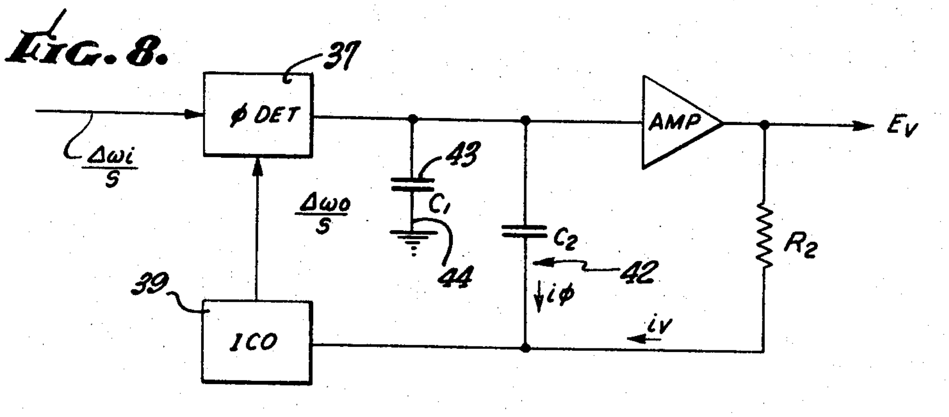
FIG. 8 illustrates another modified loop filter.

In that form of the invention seen in FIG. 7, the capacitance $C_1$ is connected across the output from the phase sensitive detector and the input to the oscillator; and in FIG. 8 the capacitance includes one leg 42 connected across the output from the detector 37 and the input to oscillator 39, and another leg 43 connected between the output from detector 37 and a common terminal 44 or ground.

Figure 2A:
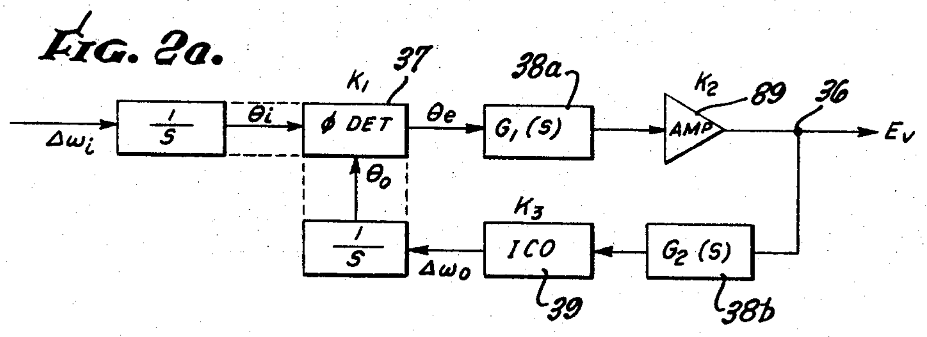
FIG. 2 is a block diagram of phase locked loop system with a current mode loop filter.
Figure 2B:
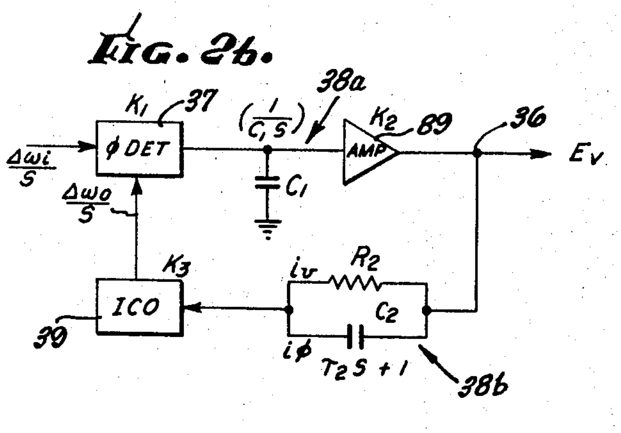

A functional block diagram of the phase locked loop system of FIG. 2*b* is shown in FIG. 2*a* in which:

$\omega_c$=Band center frequency in rad/sec.

$\Delta\omega_i$=Deviation of input frequency from band center frequency in rad/sec.

$\Delta\omega_o$=Deviation of ICO frequency from band center frequency in rad/sec.

$\phi_i$=Phase angle of the input frequency in radians.

$\phi_o$=Phase angle of the ICO frequency in radians.

$K_1$=Phase detector gain in ma./rad.

$K_2$=Gain of buffer amplifier.

$K_3$=ICO gain constant in $\dfrac{\text{rad/sec.}}{\text{ma.}}$ $K=K_1, K_2, K_3$=total loop gain in sec.$^{-1}$.

$\tau_1=C_1R$, a loop filter time constant.

$\tau_2=C_2R$, a loop filter time constant.

$G_1(S)=\dfrac{1}{C_1S}$=transfer function of loop filter portion in the forward loop.

$G_2(S)=\tau_2S+1$=transfer function of loop filter portion in the back loop.

$I_d$=Phase locked loop output voltage in volts.

$S$=Laplace operator.

$\omega_n$=Undamped natural frequency of the phase locked loop in rad/sec.

$\zeta$=Damping factor of the phase locked loop.

A linear mathematical model of the phase locked loop system can be written as follows:

$$\phi_o(S)=\frac{E_v(S)K_3}{R_2S}(\tau_2S+1) \tag{1}$$

$$E_v(S)=[\phi_i-0_o](S)\frac{K_1K_2}{C_1S} \tag{2}$$

Combining 1 and 2, and simplifying $$\frac{E_v(S)}{\phi_i(S)}=\frac{K_1K_2}{C_1}\cdot\frac{S}{S^2+K\frac{\tau_2}{\tau_1}S+\frac{K}{\tau_1}} \quad (3)$$

but, $$\phi_i(S)=\frac{\Delta\omega_i(S)}{S} \quad (4)$$

hence, $$\frac{E_v(S)}{\Delta\omega_i(S)}=\frac{K_1K_2}{C_1}\cdot\frac{1}{S^2+K\frac{\tau_2}{\tau_1}+\frac{K}{\tau_1}} \quad (5)$$

As regards the invention, the most significant aspect of Equation 5 is that there is no zero term in the numerator of that expression. This is due to the fact that damping is controlled in the back section **38*b* of the loop, and the integrating means or capacitor $C_1$ is contained in a substantially resistance free shunt path in the forward section 38*a*** of the loop filter. In essence, the frequency to voltage transfer function of the phase locked loop of FIG. 2 can be represented, as in FIG. 3, by a pair of conjugate complex poles in the left half of the S-plane, which lie on a circle of radius $\omega_n$, centered at the origin. A line segment from the origin to the pole in the second quadrant makes an angle $\alpha$ with respect to the negative real axis, where $$\zeta=\cos\alpha \quad (6)$$

From Equation 5

$$\omega_n=\sqrt{\frac{K}{\tau_1}} \quad (7)$$

and $$\zeta=\frac{\tau_2}{2}\sqrt{\frac{K}{\tau_1}} \quad (8)$$

In a conventional phase locked loop system, as shown in FIG. 4, the transfer function of the loop filter is of the form $$f_1(s)-\frac{\tau_2S+1}{\tau_1S+1} \quad (9)$$

where $$\tau_1=(R_1+R_2)C \quad (10)$$

and $$\tau=R_2C \quad (11)$$

The frequency to voltage transfer function of a conventional phase locked loop system is given by the equation:

$$\frac{E_v(S)}{\Delta\omega_i(S)}=\frac{K_1K_2}{\tau_1}\cdot\frac{\tau_2S+1}{S^2+\left(\frac{1+K\tau_2}{\tau_1}\right)S+\frac{K}{\tau_1}} \quad (12)$$

Since there is a "zero" term, $(\tau_2s+1)$, in the numerator of Equation 12 the amplitude response of a conventional phase locked loop system has an undesirable rise 46 near the loop cutoff frequency, a comparison of the responses of Equations 5 and 12 for $\zeta=1\sqrt{2}$ being shown in FIG. 5.

The relative pole/zero locations of a conventional PLL system are shown in FIG. 6.

Figure 9:
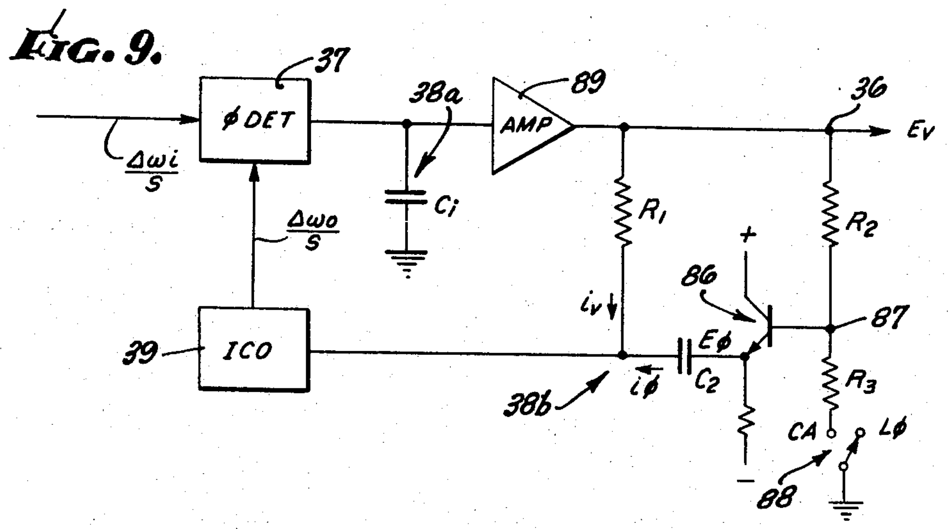
FIG. 9 illustrates the provision for remote control of damping factor.

FIG. 9 illustrates one preferred form of means for remotely controlling loop damping factor, as applied to a phase locked loop of the general type previously described in connection with FIGURE 2*b*, the same numbers being used. The loop filter section **38*b* includes capacitor $C_2$ connected in shunt relation with resistance $R_1$ and in series circuit between the amplifier output and the oscillator input. Capacitor $C_2$ is connected via a transistor 86, as shown, with point 87 of a voltage divider that includes resistors $R_2$ and $R_3$, the divider having voltage $E_v$ applied at point 36. A SPDT switch 88** is also connected as shown.

With switch 88 in the linear phase ($L\phi$) position and $C_1$ and $C_2$ selected for $\zeta=\sqrt{3/2}$, the phase locked loop system will have a linear phase transfer function. When switch 88 is switched to the constant amplitude (CA) position, the voltage $E_\phi$ driving $C_2$ is given by the expression:

$$E_\phi=kE_v$$

where $$k+\frac{R_2}{R_2+R_3}$$

The net effect on the circuit is as though there is a new value of $C_2$, expressed as $$C_2=kC_2$$

Then from Equation 8

$$\zeta'=\frac{\tau_2}{2}\sqrt{\frac{K}{\tau_1}}$$

and the value of $k$ determines the damping factor:

$$\zeta'=1\sqrt{2}$$

In a practical embodiment of this invention, the current mode loop filter of FIG. 9 acts to advance the phase of the current controlled oscillator (ICO) as the frequency is increasing and to retard the phase of the ICO as the frequency is decreasing. This causes what might be termed a closing aperture effect at the phase detector. Referring to FIG. 10, which shows the waveforms for a quadrature type phase detector, $i_\phi$ current flowing during the time period from $t_0$ to $t_1$ will advance the phase of the ICO output waveform, reducing the period of $t_0$—$t_1$ over what it would have been if there were no $I_c$ current during this time. Stated another way, the phase difference $(\phi_1-\phi_o)$ during the period $t_0$—$t_1$ will be less than it would have been without $i_\phi$ current, while during the period $t_1$—$t_2$ the phase difference will be correct, being unaffected by phase advance current $i_\phi$. The current waveform is shown in FIG. 10E.

Current $i_\phi$ is related to the detector output current $I_d$ by the following expression:

$$i_\phi=I_dK_2\frac{C_2}{C_1}$$

This current flowing for the period of the phase difference $(\phi_1-\phi_o)=\Delta t$ is a charge $$q_\phi=i_\phi\Delta t$$

but this also is equal to the voltage difference across $C_2$ times the capacitance, or $$q_\phi=C_2\Delta E_v$$

where $$\Delta E_v=K_2\frac{(\phi_i-\phi_o)I_d}{C_1}$$

With an increasing input frequency, the correct phase difference is obtained by inhibiting $i_\phi$ when it would advance the phase of the ICO, during the period $t_0$–$t_1$, and dumping charge $q_\phi$ into the ICO during the period $t_1$–$t_2$.

It can be readily observed that while $i_\phi$ is inhibited, the change in voltage $\Delta E_v$ is stored on $C_1$, so that the correct charge $q_\phi$ will be fed into the ICO during the period $t_1$–$t_2$, when it cannot affect the phase difference $(\phi_1-\phi_o)$.

Figure 11:
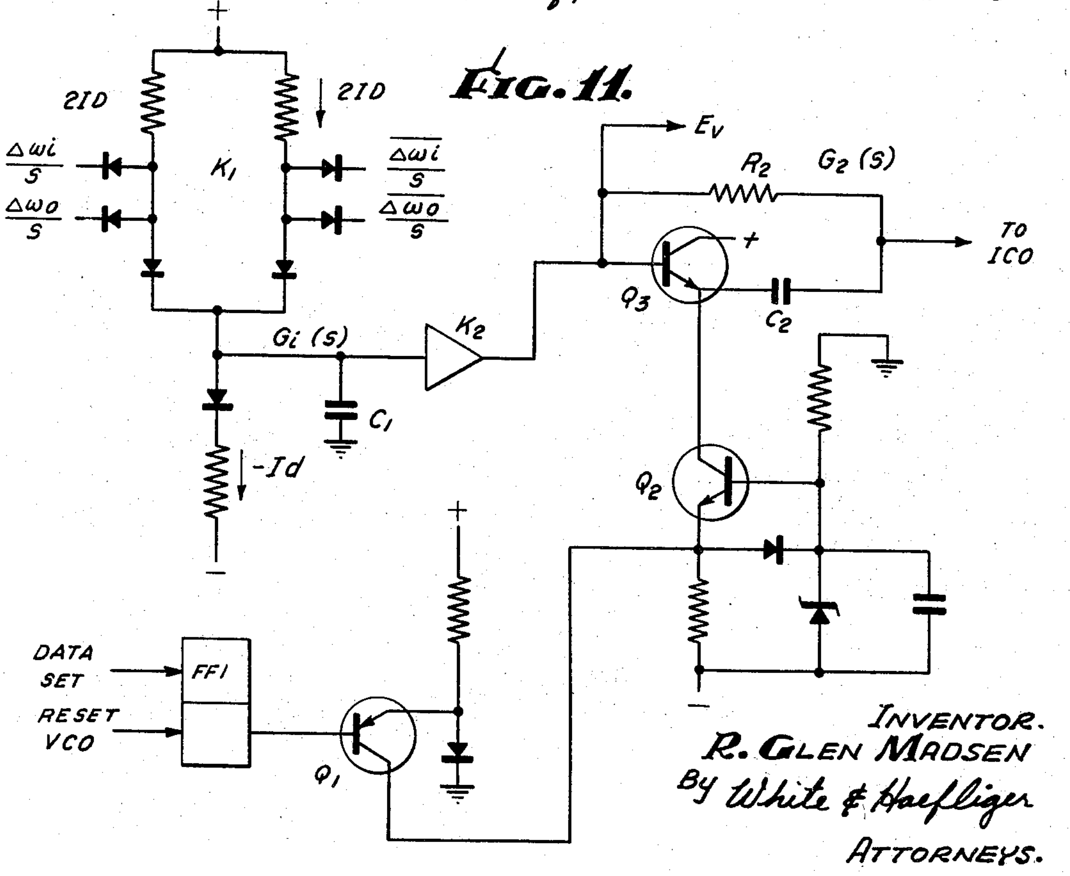
FIG. 11 illustrates the provision of gated phase reset using a quadrature by the phase detector.

A gated phase reset circuit which accomplishes the above, and which operates in conjunction with a quadrature type phase detector 110, is shown in FIG. 11. At time $t_0$, FIG. 10, flip-flop FF1 is set, which turns on $Q_1$, thereby turning off $Q_2$ and $Q_3$. During the period $t_0$–$t_1$, $E_v$ is decreasing as in FIG. 10D. Referring also to FIG. 10F, with $Q_3$ off, no charging current $i_\phi$ flows through $C_2$. At time $t_1$, FF1 is reset which turns off $Q_1$, thereby turning on $Q_2$.

Current through $Q_2$ discharges $C_2$ until the base, emitter junction of $Q_3$ is again conducting, and with $Q_3$ on then, $C_2$ again charges as $E_v$ rises for the remainder of time period $t_1$–$t_2$. With a fixed input frequency, $$|-q_\phi|=|+q_\phi|$$

and the net phase shift of the ICO is zero. With an increasing input frequency, $$|-q_\phi|>|+q_\phi|$$

which causes a net phase advance of the ICO, or with a decreasing input frequency, $$|-q_\phi|<|+q_\phi|$$

causing a net phase retard of the ICO. Whether one thinks of the ICO phase advance/retard mechanism as operating on a current basis, $i_\phi$, or a charge basis, $q_\phi$, the effect on the performance of the loop is the same, since both factors are functions of $C_2$.

Figures 12, 13:
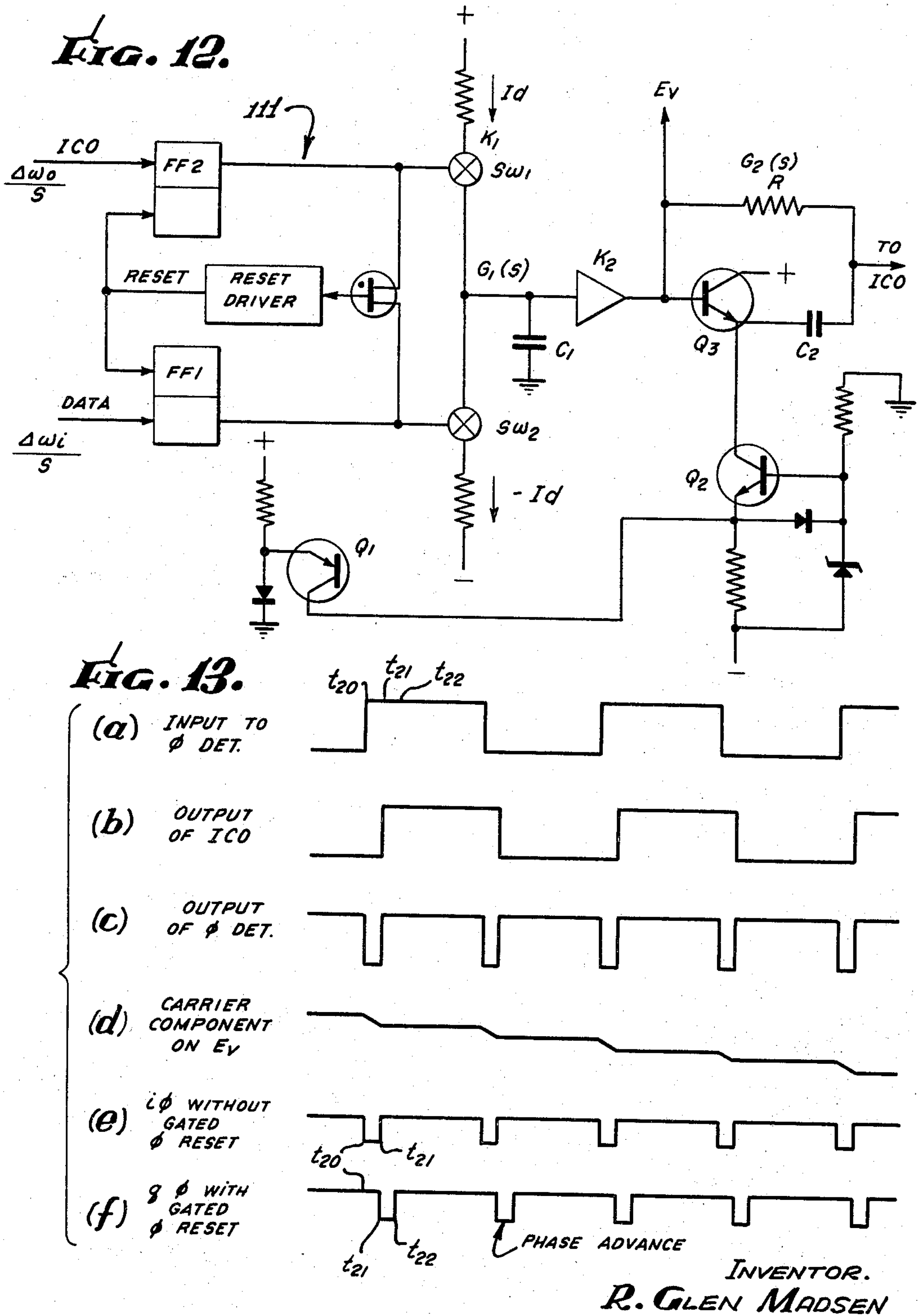
FIG. 12 illustrates the provision of gated phase reset using another type phase detector.
FIG. 13 illustrates waveforms with another type phase detector.

A gated phase reset circuit operating in conjunction with a phase detector 111 as described in my co-pending application "Phase Detector for Phase Locked Loop Frequency detector" is shown in FIG. 12. Typical waveforms associated with this circuit and embodying the loop filter as described herein are shown in FIG. 13. The input waveform 13A is shown leading the phase of the ICO output waveform 13B in order to show an output 13C from the phase detector 111. With a leading input waveform, flip-flop FF1 is set on data input and reset on input from the ICO. The change in voltage at $E_v$ is $$-\Delta E_v=K_2\frac{(\phi_i-\phi_o)(-I_d)}{C_1}$$

When FF1 is set, $Q_1$ turns on, thereby turning off $Q_2$ and $Q_3$, inhibiting $i_\phi$ current to the ICO. When FF1 is reset by the ICO, $Q_1$ turns off, turning on $Q_2$. Current through $Q_2$ discharges $C_2$ by an amount $\Delta E_v$, at which time the base/emitter junction of $Q_3$ conducts and all the current for $Q_2$ is supplied by $Q_3$. The charge transferred to the ICO is $$-q_\phi=-\Delta E_v C_2$$

except that it is delayed from the period $t_{20}$–$t_{21}$ to the period $t_{21}$–$t_{22}$, so that phase advance caused by $-q_\phi$ will not affect the phase difference $(\phi_i-\phi_o)$.

Figure 14:
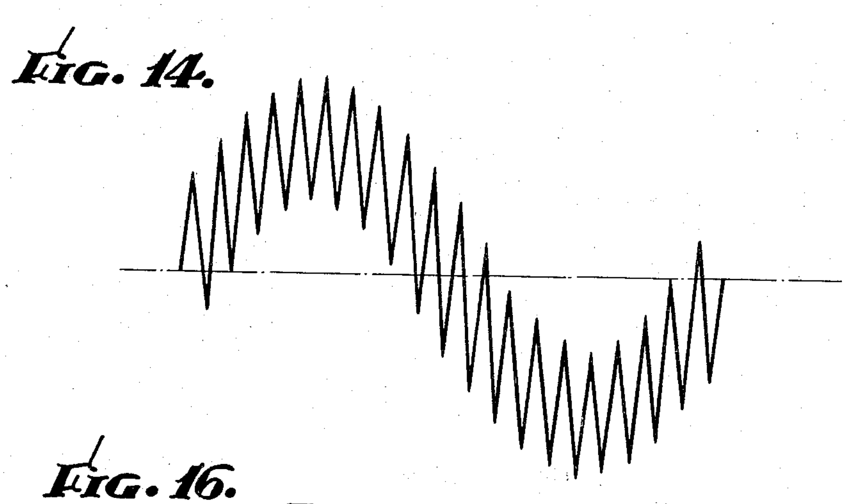
FIG. 14 shows output voltage $E_v$ of a phase locked loop using a conventional phase detector and conventional loop filter.
Figure 16:
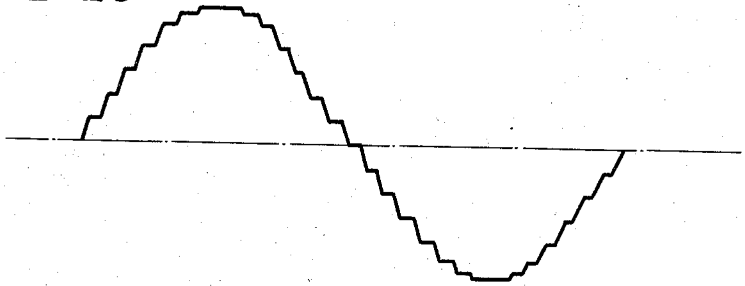
FIG. 16 shows output voltage $E_v$ of a phase locked loop using the phase detector of FIG. 12 and a current mode loop filter of the present invention.
Figure 15:
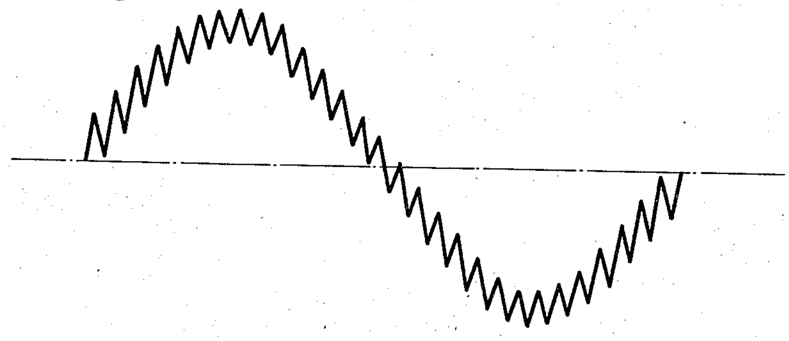
FIG. 15 shows output voltage $E_v$ of a phase locked loop using a conventional phase detector and a current mode loop filter of the present invention.

The waveform in FIG. 14 shows a typical output voltage, $E_v$, of a PLL with a conventional type of PSD and loop filter when the input signal is frequency modulated with a sinusoidal signal. With the same input signal, FIG. 16, and FIG. 15 show comparative output signals using the current mode loop filter of the present invention. The waveform of FIG. 16 is the output of a PLL with the phase detector of FIG. 12, while the waveform of FIG. 15 is the output of a PLL with a conventional phase detector. The difference in carrier level of the waveforms in FIGS. 14 and 15 is typically 12 db for the same loop cutoff frequency and damping factor.

I claim:

1. In combination in a phase locked loop frequency to voltage converter that includes a phase sensitive detector and a tracking oscillator connected in a loop, an improved loop filter that comprises current integrating means and loop damping means connected in series circuit sequence between the output from the phase sensitive detector and the input to the oscillator, the output of the loop being taken at a point between said integrator means and said loop damping means, and said loop having a frequency to voltage transfer function characterized by the absence of a zero term in the numerator thereof.

2. The filter of claim 1, in which said integrating means comprises capacitance connected in current integrating mode, said damping means comprises resistance, and including a DC amplifier connected between said capacitance and said resistance to isolate the integrating means and loop damping means and to provide said filter output.

3. The filter of claim 2 including additional capacitance connected in shunt relation with said resistance and in series circuit between the output from the amplifier and the input to the oscillator.

4. The filter of claim 2, in which said capacitance is connected across the output from the phase sensitive detector and the input to the oscillator.

5. The filter of claim 2, in which said capacitance includes one leg connected across the output from the phase sensitive detector and the input to the oscillator, and another leg connected between the output from the phase sensitive detector and a common terminal.

6. The filter of claim 2 including remotely controllable means to alter the damping ratio of the loop.

7. The filter of claim 2 including a substantially resistance free shunt path containing said capacitance.

8. The filter of claim 1 and including said oscillator together with means to inhibit such current flow in said loop damping means as would tend to advance the phase of the oscillator output during the interval of phase difference measurement.

9. The combination of claim 1 wherein said oscillator has an input terminal to receive control current.

References Cited

UNITED STATES PATENTS

| | | | |
|---|---|---|---|
| 2,932,793 | 4/1960 | Smith et al. | 331—17 |
| 2,986,703 | 5/1961 | Pollak | 331—17 |
| 3,158,820 | 11/1964 | Lamplot | 331—17 |
| 3,249,876 | 5/1966 | Harrison | 331—17 |
| 3,283,260 | 11/1966 | Vaughn | 331—17 |

JOHN KOMINSKI, *Primary Examiner.*